US007081678B2

(12) United States Patent
Liu

(10) Patent No.: US 7,081,678 B2
(45) Date of Patent: Jul. 25, 2006

(54) MULTI-CHIP PACKAGE COMBINING WIRE-BONDING AND FLIP-CHIP CONFIGURATION

(75) Inventor: Cheng-Cheng Liu, Douliou (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/781,876

(22) Filed: Feb. 20, 2004

(65) Prior Publication Data

US 2004/0195700 A1 Oct. 7, 2004

(30) Foreign Application Priority Data

Apr. 4, 2003 (TW) .............................. 92205447 U

(51) Int. Cl.
*H01L 23/48* (2006.01)

(52) U.S. Cl. ...................... 257/778; 257/784; 257/786
(58) Field of Classification Search ........ 257/776–781, 257/784, 786
See application file for complete search history.

(56) References Cited

U.S. PATENT DOCUMENTS

| 5,847,929 | A  | * | 12/1998 | Bernier et al. ............. 361/719 |
| 6,191,360 | B1 | * | 2/2001  | Tao et al. ................... 174/52.4 |
| 6,525,406 | B1 | * | 2/2003  | Chung et al. ............... 257/666 |
| 6,605,869 | B1 | * | 8/2003  | Kimura ...................... 257/723 |
| 6,677,668 | B1 | * | 1/2004  | Lin ............................ 257/685 |

FOREIGN PATENT DOCUMENTS

CN          TW466719        12/2001

* cited by examiner

*Primary Examiner*—Hung Vu
(74) *Attorney, Agent, or Firm*—Troxell Law Office, PLLC

(57) ABSTRACT

A multi-chip package combining wire-bonding and flip-chip configuration includes a plurality of chips, a substrate and a molding compound. Chip(s) with wire-bonding type and a flip-chip type electrical device are mounted on an upper surface of the substrate. A plurality of contact pads of the substrate are formed on the upper surface of the substrate that are not covered by the molding compound, so the flip-chip type electrical device can be electrically connected to these contact pads. The molding compound has recession(s) from a molding tool and seals the chip(s) with wire-bonding type without damaging the contact pads during molding process.

12 Claims, 4 Drawing Sheets

MULTI-CHIP PACKAGE COMBINING WIRE-BONDING AND FLIP-CHIP CONFIGURATION

FIELD OF THE INVENTION

The present invention relates to a multi-chip package (MCP), and more particularly to a multi-chip package combining wire-bonding and flip-chip configuration.

BACKGROUND OF THE INVENTION

Based on the more request of the semiconductor package, a multi-chip package is developed for assembling a plurality of chips which having the same or different functions to make a system in package (SIP). According the different types of the chips, the multi-chip package assembles several kinds of chips by wire-bonding and flip-chip connection.

R.O.C. Taiwan Patent No. 466719 entitled "multi chip module packaging method by mixing chip and package" disclosed a multi-chip module package. An encapsulating material on a substrate seals a wire-bonding chip and a chip scale package. The chip scale package is flip-chip mounted on the substrate, which includes a chip and a sub-package body. After mounting the chip scale package and the wire-bonding chip on the substrate, the encapsulating material seals the chip scale package and the wire-bonding chip by molding. To seal the chip scale package the substrate should have a larger dimension. In addition, the chip scale package is sealed inside the encapsulating material, so the chip scale package cannot be reworked after molding. When the functions test result of the multi-chip module package is NG, the whole package has to be scrapped. If the chip scale package is designed outside the encapsulating material, the plurality of contact pads on the substrate for electrically connecting the chip scale package are easily damaged by a molding tool for molding the encapsulating material, especially there is pre-solder printed on the contact pads. It would easily cause the substrate warpage.

SUMMARY OF THE INVENTION

A primary object of the present invention is to provide a multi-chip package combining wire-bonding and flip-chip configuration. A molding compound with a recession is formed on a substrate by a molding tool with an arc recession to seal chip(s) with wire-bonding connection. The recession of the molding compound does not cover a plurality of contact pads of the substrate for connecting with a flip-chip type electrical device. The molding tool with the arc recession avoids damaging the contact pads during molding process. And the substrate has a smaller dimension to configure the chip(s) with wire-bonding connection and the flip-chip type electrical devices.

A second object of the present invention is to provide a multi-chip package combining wire-bonding and flip-chip configuration. A molding compound with a recession seals at least a wire-bonding chip on an upper surface of a substrate and exposes the partial upper surface. At least a flip-chip type electrical device is mounted on the exposed upper surface to provide a high-density multi-chip package combining wire-bonding and flip-chip configuration. The molding compound has a plurality of symmetric extensions from the recession to reduce substrate warpage.

According to the multi-chip package combining wire-bonding and flip-chip configuration of the present invention, the package comprises a substrate, at least a wire-bonding chip, a molding compound and at least a flip-chip type electrical device. The substrate has an upper surface, a lower surface and a plurality of contact pads formed on a flip chip region of the upper surface. The wire-bonding chip is attached to the upper surface and electrically connected to the substrate by bonding wires. The molding compound is formed on the partial upper surface for sealing the wire-bonding chip but exposes the contact pads reserved for flip chip electrical devices. The molding compound has at least a recession. Preferably, the recession is in a shape of an arc in order to keep a distance from the nearest contact pads for clamping the molding tool. Perfectly, the distance is over 1.0 mm to avoid damaging the contact pads during molding process. And the flip-chip type electrical device is connected to the contact pads of the substrate to form the multi-chip package combining wire-bonding and flip-chip configuration efficiently.

DETAIL DESCRIPTION OF THE INVENTION

Referring to the attached drawings, the present invention will be described by means of the embodiments below.

Figure 1:
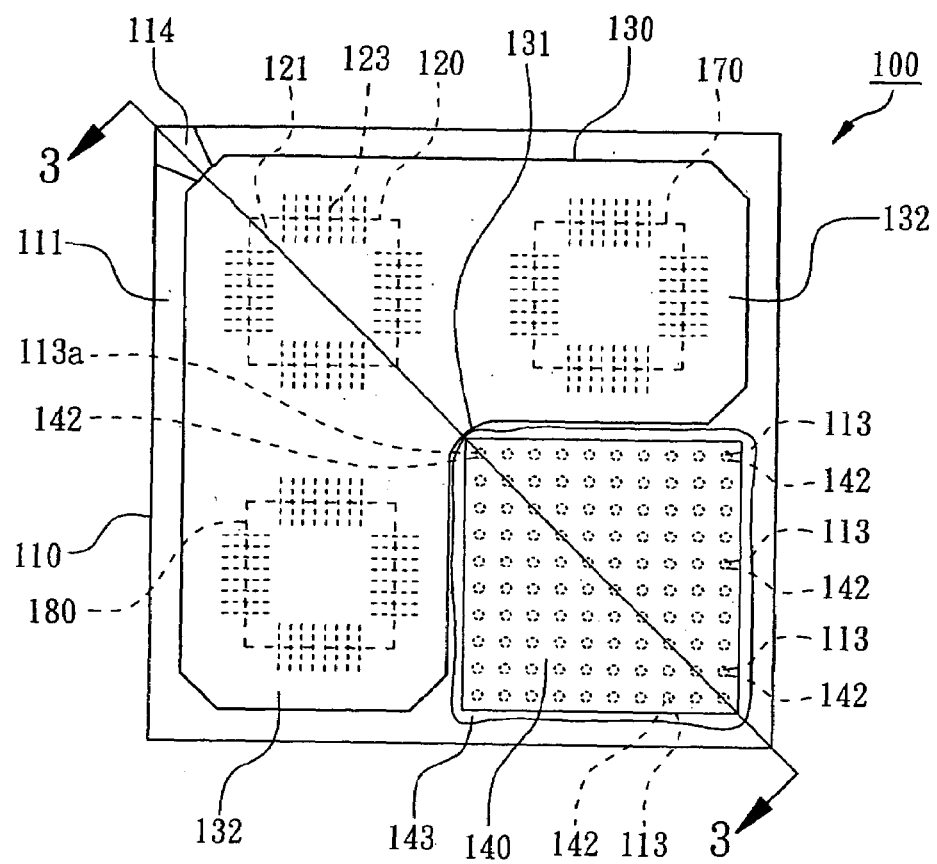
FIG. 1 is a top view illustrating a multi-chip package combining wire-bonding and flip-chip configuration according to a first embodiment of the present invention.
Figure 2:
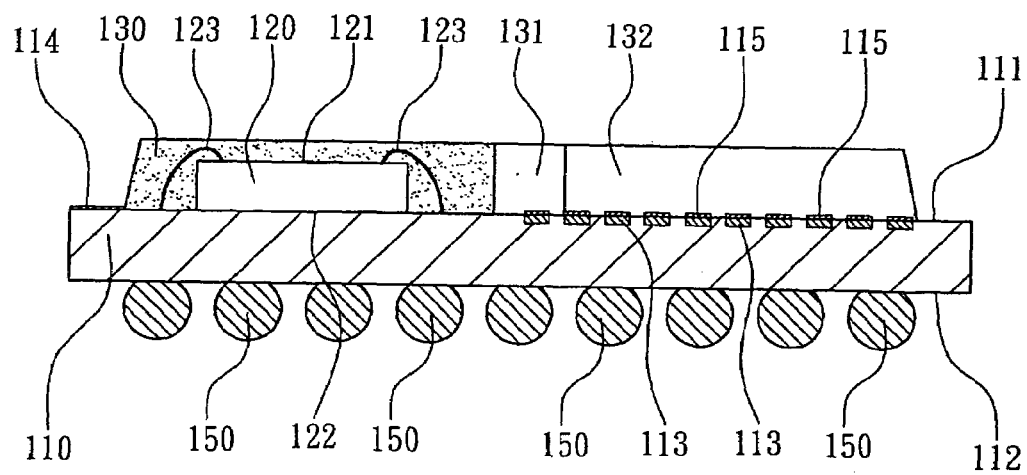
FIG. 2 is a cross-section view illustrating the multi-chip package including wire-bonding chip before mounting a flip-chip type electrical device according to the first embodiment of the present invention.
Figure 3:
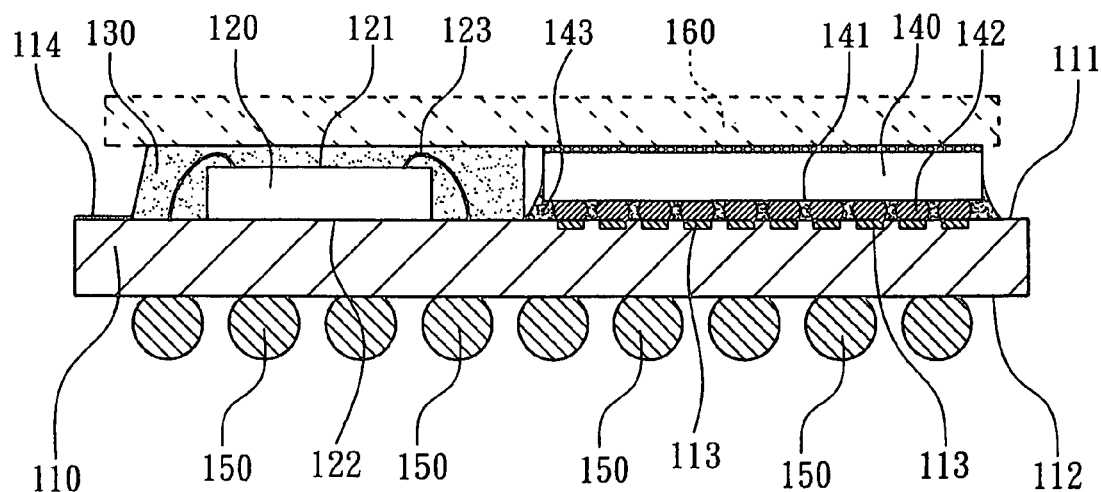
FIG. 3 is a cross-section view illustrating the multi-chip package combining wire-bonding and flip-chip configuration across I—I line of FIG. 1 according to the first embodiment of the present invention.

According to a first embodiment of the present invention, a multi-chip package 100 combining wire-bonding and flip-chip configuration is showed in FIGS. 1, 2 and 3. FIG. 1 is a top view illustrating the multi-chip package 100. FIG. 2 is a cross-section view illustrating the multi-chip package 100 before mounting a flip-chip type electrical device 140. FIG. 3 is a cross-section view illustrating the multi-chip package 100 across I—I line of FIG. 1. The multi-chip package 100 comprises a substrate 110, at least a wire-bonding chip 120, a molding compound 130 and at least a flip-chip type electrical device 140.

Referring to FIGS. 1 and 3, the substrate 110, such as multi-layer printed circuit board or multi-layer ceramic substrate, has an upper surface 111 and a lower surface 112. A plurality of contact pads 113 are formed on the upper surface 111, and wiring traces electrically connect the upper surface 111 and the lower surface 112 (not show in the drawings). At least a wire-bonding chip 120 is attached to the upper surface 111 of the substrate 110 and is sealed by the molding compound 130. In this embodiment, there are wire-bonding chips 120, 170 and 180 are sealed by the molding compound 130 on the upper surface 111 of the substrate 110, so the molding compound 130 can be designed for sealing a single or multiple chips.

The wire-bonding chip 120 means all kinds of integrated circuit chip electrically connected by wire bonding. Referring to FIG. 3, the wire-bonding chip 120 has an active surface 121 and a back surface 122. The back surface 122 of the wire-bonding chip 120 is attached to the upper surface 111 of the substrate 110. A plurality of peripheral bonding pads are formed on the active surface 121 (not show in the drawings), which are electrically connected to the substrate 110 via a plurality of bonding wires 123. The molding compound 130 seals the wire-bonding chip 120 and the bonding wires 123.

The molding compound 130 is selectively molded on the upper surface 111 of the substrate 110 so as to partially cover the upper surface 111 of the substrate 110 for sealing the wire-bonding chip 120, 170 and 180, but expose a flip chip region of the upper surface 111 for mounting the flip-chip type electrical device 140. The molding compound 130 is formed from a molding cavity of a molding tool through a molding gate metal layer 114 on the upper surface 111 of the substrate 110 by a conventional molding technology. And the molding tool is designed with an arc recession in order to form the molding compound 130 having at least a recession 131. The molding gate metal layer 114 extends from periphery of the substrate 110 to the molding region opposing to the recession 131. Preferably, the recession 131 is in a shape of an arc. The molding compound 130 exposes the contact pads 113 of the substrate 110 because of the recession 131. Since the distance between the arc recession 131 of the molding compound 130 and the nearest contact pads 113a is more than 1.0 mm, which 1.6 mm is better, the clamping area of the molding tool along the arc recession 131 will not contact the contact pads 113 on the upper surface 111 of the substrate 110 during molding process. More preferably, the recession 131 is in a shape of a quarter-circle to keep the distance constant.

Referring to FIG. 2, the molding compound 130 is formed prior to mounting the flip-chip type electrical device 140. When molding the molding compound 130, the contact pads 113 has a pre-solder 115 formed on them in order to mount the flip-chip type electrical device 140 in flip chip mounting process. The pre-solder 115 is slightly protruded from the upper surface 111 of the substrate 110. Because of the recession 131, a molding tool for forming the molding compound 130 will not contact the contact pads 113 or pre-solder 115 so that the contact pads 113 will not be damaged. The molding compound 130 has a plurality of symmetric extensions 132 from the recession 131 to improve the warpage of the substrate 110. In this embodiment, the molding compound 130 is L-shape and partially covers the upper surface 111 of the substrate 110 except the flip chip region (as show in FIG. 1). In addition, the flip-chip type electrical device 140 is mounted on the exposed upper surface 111 (the flip chip region) of the substrate 110 that is not covered by the molding compound 130. The flip-chip type electrical device 140 includes at least a kind of integrated circuit chip in flip chip type, such as a flip chip with array bumps, a chip scale package (CSP), a wafer level chip scale package (WLCSP) or BGA package. In the embodiment, the flip-chip type electrical device 140 is a flip chip that is mounted on the exposed upper surface 111 of the substrate 110. The flip chip (i.e. flip-chip type electrical device 140) has an active surface 141. A plurality of electric bumps 142 are formed on the active surface 141, and connect the contact pads 113 of the substrate 110. The wire-bonding chip 120 inside the molding compound 130 and the flip-chip type device 140 are combined on the upper surface 111 of the substrate 110. Preferably, an underfilling material 143 is filled between the flip-chip type electrical device 140 and the substrate 110 to seal the bumps 142. Referring to FIG. 3, a heat sink 160 may be placed on the upper surface 111 of the substrate 110. The heat sink 160 is attached to the molding compound 130 and the flip-chip type electrical device 140 to improve the heat dissipation of the multi-chip package 100 and to reduce the warpage of the substrate 110. After configuring the wire-bonding chips 120, 170, 180 and flip-chip type electrical device 140, a plurality of solder balls 150 are placed on the lower surface 112 of the substrate 110 which electrically connect the wire-bonding chips 120, 170, 180 and flip-chip type electrical device 140 respectively to become a multi-chip ball grid array package.

So, the multi-chip package 100 of the present invention has the capability of configuring both the wire-bonding and flip-chip type in a multi-chip package, moreover, the molding compound 130 will not damage the contact pads 113 during the molding process. Because that the molding compound 130 has an recession 131 not to seal the flip-chip type electrical device 140, therefore, the substrate 100 does not need to increase substrate dimension to accommodate underfilling material(s) 143 for the flip-chip type electrical device 140. The dimension of the substrate 110 can be reduced to form a smaller multi-chip package combining wire-bonding and flip-chip configuration, meanwhile, the consumption of the molding compound 130 can also be reduced.

Figure 4:
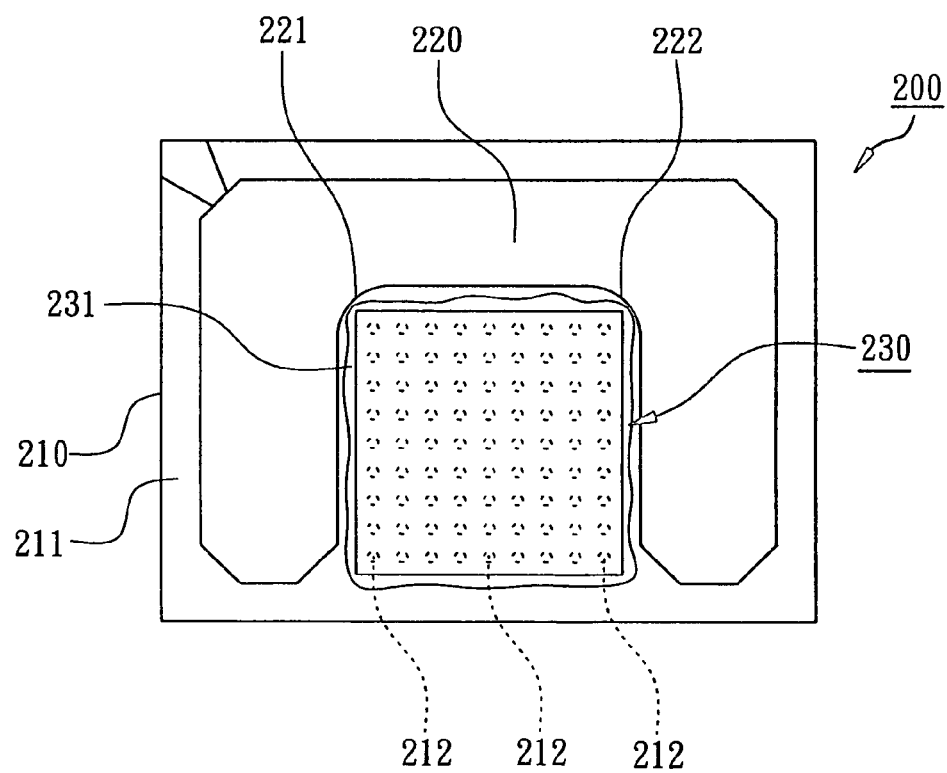
FIG. 4 is a schematic top plane view of a multi-chip package combining wire-bonding and flip-chip configuration according to a second embodiment of the present invention.

Referring to FIG. 4, another multi-chip package 200 combining wire-bonding and flip-chip configuration is disclosed according to a second embodiment of the present invention. The multi-chip package 200 comprises a substrate 210, a molding compound 220 and a flip-chip type electrical device 230. An upper surface 222 of the substrate 210 has a plurality of contact pads 212. The molding compound 220 formed by molding process seals at least an integrated circuit chip electrically connecting by wire bonding (not show in the drawing). The molding compound 220 partially covers the upper surface 211 of the substrate 210 but not covers the contact pads 212. In this embodiment, the molding compound 220 has a first recession 221, a second recession 222 and two symmetric extensions from the recession 221, 222. The molding compound 220 is in a U-shape to expose the contact pads 212 on the substrate 210. The recession 221, 222 are in a shape of an arc to keep a suitable distance from each recession 221, 222 to the contact pads 212 is kept around 1.0~3.0 mm, so the contact pads 212 and the pre-solder thereon (not show in the drawing) will not be damaged by a molding tool during molding process. The flip-chip type electrical device 230 is mounted on the exposed region of the upper surface 211, which is not covered by the molding compound 220, and is electrically connected to the contact pads 212. Therefore it is possible to rework the flip-chip type electrical device 230 after flip chip mounting process. The multi-chip package 200 can be configured both the wire-bonding and flip-chip type chips without damaging the contact pads 212 during the molding process and improve the yield of assembly MCP's.

Figure 5:
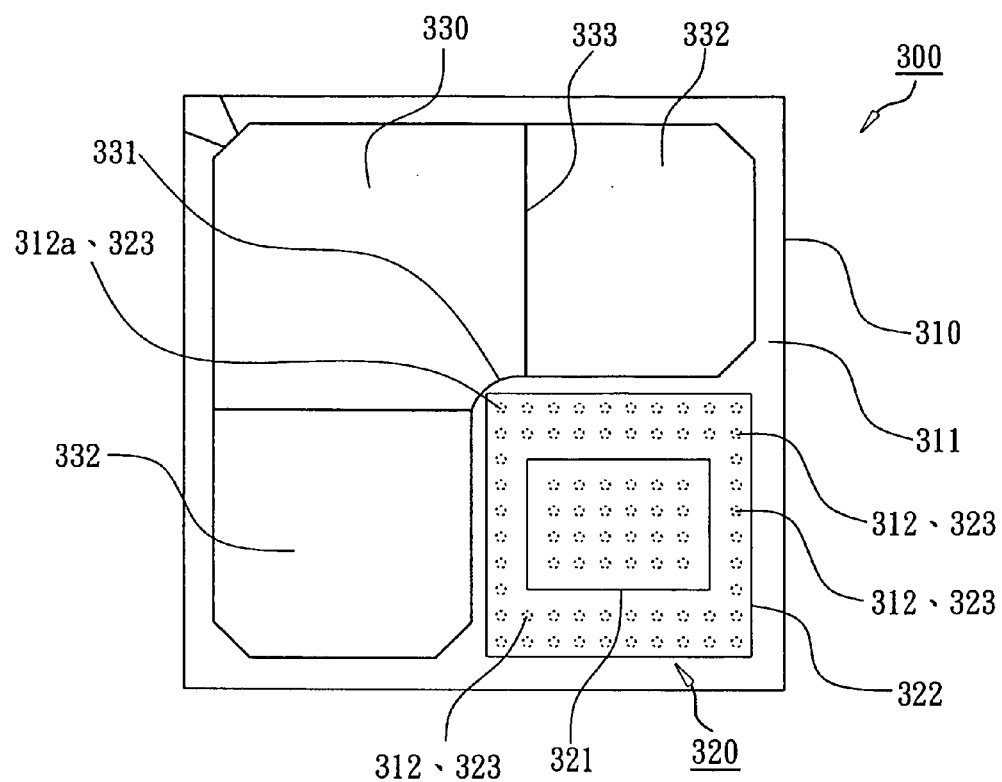
FIG. 5 is a schematic top plane view of a multi-chip package combining wire-bonding and flip-chip configuration according to a third embodiment of the present invention.
Figure 6:
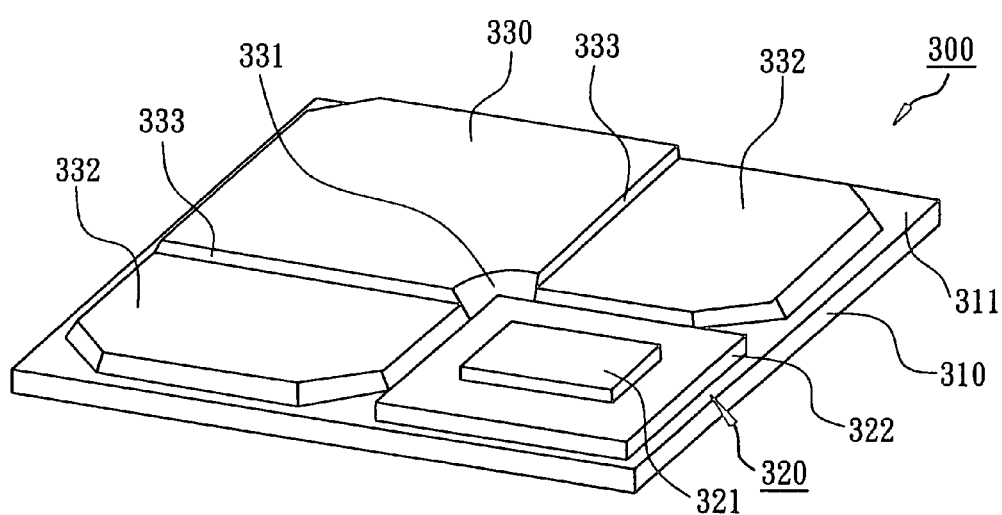
FIG. 6 is a schematic 3-D view of the multi-chip package combining wire-bonding and flip-chip configuration according to the third embodiment of the present invention.

Furthermore, the molding compound has many kinds of equivalent variations. A third and a forth embodiments according to the present invention are illustrated for easily understanding. Referring to FIGS. 5 and 6, a multi-chip package 300 is disclosed according to the third embodiment of the present invention. The multi-chip package 300 comprises a substrate 310 having a plurality of contact pads 312 and 312a, a flip-chip type electrical device 320 and a molding compound 330. The molding compound 330 is selectively formed on the upper surface 311 of the substrate 310 and seals at least a semiconductor chip (not show in the drawing), without covering the contact pads 312 and 312a formed on the partially exposed upper surface 311. The molding compound 330 has a recession 331 in a shape of an arc to keep the recession 331 a suitable distance from the nearest contact pads 312a which should be more than 1.0 mm, to avoid a molding tool to damage the contact pad 312, 312a during the molding process. The molding compound 330 forms a step 333 (as show in the FIG. 6) at connecting portion of the symmetric extensions 332 (at two sides) to decrease the thickness of the symmetric extensions 332 in order to reduce the warpage of the substrate 310. In the third embodiment of the present invention, the flip-chip type electrical device 320 is a ball grid array flip-chip package or a chip scale package. The flip-chip type electrical device 320 includes a flip chip 321 and a substrate 322. The flip chip 321 is mounted on the substrate 322 using flip-chip configuration. On the lower surface of the substrate 321 there are a plurality of solder balls 323 which are connected with the contact pads 312 and 312a.

Figure 7:
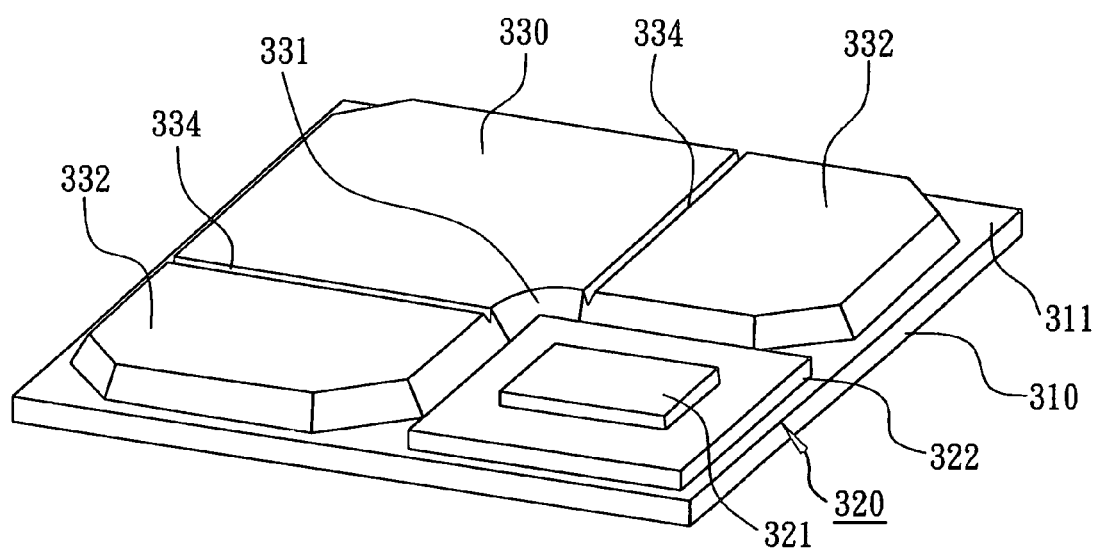
FIG. 7 is a schematic 3-D view of a multi-chip package combining wire-bonding and flip-chip configuration according to a forth embodiment of the present invention.

Referring to FIG. 7, another multi-chip package combining wire-bonding and flip-chip configuration is disclosed according to the forth embodiment of the present invention. The multi-chip package comprises some components, such as a substrate 310 with a plurality of contact pads, a molding compound 330 which seals wire-bonding chips and a flip-chip type electrical device 320, which are the same as the third embodiment of the present invention and use the same figure number. The molding compound 330 is selectively formed on the upper surface 311 of the substrate 310 by molding process. The molding compound 330 has a recession 331 and symmetric extensions 332 from two sides of the recession 331. The molding compound 330 forms an indentation 334 at the connecting portion of the symmetric extensions 332 to achieve reducing the warpage of the substrate 310.

The above description of embodiments of this invention is intended to be illustrated and not limiting. Other embodiments of this invention will be obvious to those skilled in the art in view of the above disclosure.

What is claimed is:

1. A multi-chip package combining wire-bonding and flip-chip configuration comprising:
   a) a substrate having an upper substrate surface and a lower substrate surface, the upper substrate surface having a plurality of contact pads;
   b) at least one wire bonding chip connected to the upper substrate surface and electrically connected to the substrate by a plurality of bonding wires;
   c) a molding compound having:
      i) a body formed on the upper substrate surface encapsulating each of the at least one wire bonding chip and the plurality of bonding wires;
      ii) two extensions extending from the body and along a horizontal direction on the substrate, the two extensions are substantially orthogonal; and
      iii) at least one recession having an arch shape and being located between the two extensions, the two extensions being spaced apart from the plurality of contact pads located on the upper substrate; and
   d) at least one flip-chip electrical device having a plurality of bumps electrically connected to the plurality of contact pads of the substrate.

2. The multi-chip package according to claim 1, wherein the distance between the at least one recession and a closest contact pad of the plurality of contact pads is greater than 1.0 mm.

3. The multi-chip package according to claim 1, wherein the at least one recession has a shape of a quarter of a circle.

4. The multi-chip package according to claim 1, wherein the at least one recession includes two recessions, the two recessions are symmetrical.

5. The multi-chip package according to claim 1, wherein the molding compound has an U-shape.

6. The multi-chip package according to claim 1, wherein the molding compound has an L-shape.

7. The multi-chip package according to claim 1, wherein the at least one flip-chip electrical device is selected from a group consisting of a BGA package, a chip scale package, and a flip chip.

8. The multi-chip package according to claim 1, further comprising a plurality of solder balls located on the lower substrate surface.

9. The multi-chip package according to claim 1, further comprising a heat sink connected to the molding compound and the at least one flip-chip electrical device.

10. The multi-chip package according to claim 1, wherein the molding compound has at least one step located on a surface opposite the substrate.

11. The multi-chip package according to claim 1, wherein the molding compound has at least one indentation located on a surface opposite the substrate.

12. The multi-chip package according to claim 1, wherein the substrate has a molding gate metal layer.

* * * * *